United States Patent
Uchiyama

(10) Patent No.: US 7,514,320 B2
(45) Date of Patent: Apr. 7, 2009

(54) SEMICONDUCTOR DEVICE HAVING INCREASED CAPACITANCE OF CAPACITOR FOR DATA STORAGE AND METHOD OF MANUFACTURING SEMICONDUCTOR DEVICE

(75) Inventor: Hiroyuki Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 135 days.

(21) Appl. No.: 11/652,072

(22) Filed: Jan. 11, 2007

(65) Prior Publication Data

US 2007/0161177 A1    Jul. 12, 2007

(30) Foreign Application Priority Data

Jan. 12, 2006  (JP) .............................. 2006-004827

(51) Int. Cl.
*H01L 21/8242* (2006.01)
(52) U.S. Cl. ...................... 438/253; 438/254; 438/396; 257/E27.048
(58) Field of Classification Search ..................... 438/3, 438/253–256, 396–399; 257/E27.048
See application file for complete search history.

(56) References Cited

U.S. PATENT DOCUMENTS

2002/0163026 A1 * 11/2002 Park .......................... 257/301

FOREIGN PATENT DOCUMENTS

JP        2000-332213        11/2000

* cited by examiner

*Primary Examiner*—H. Jey Tsai
(74) *Attorney, Agent, or Firm*—McGinn IP Law Group, PLLC

(57) ABSTRACT

A semiconductor device of the present invention comprises a memory cell area having memory cells arranged in an array form, each of which includes a capacitor for storing data and a peripheral circuit area for accessing the memory cell area. The peripheral circuit area is provided with a plurality of wiring layers and each of the memory cells has a capacitor. The capacitor is comprised of a plate electrode, a capacitive insulating film formed on a side wall of an opening formed through the plate electrode, and a storage electrode embedded in the opening in which the capacitive insulating film is formed on the side wall, such that the plate electrodes, the capacitive insulating films, and the storage electrodes of the memory cells are arranged in correspondence to the plurality of wiring layers, and the storage electrodes are connected to one another.

4 Claims, 16 Drawing Sheets

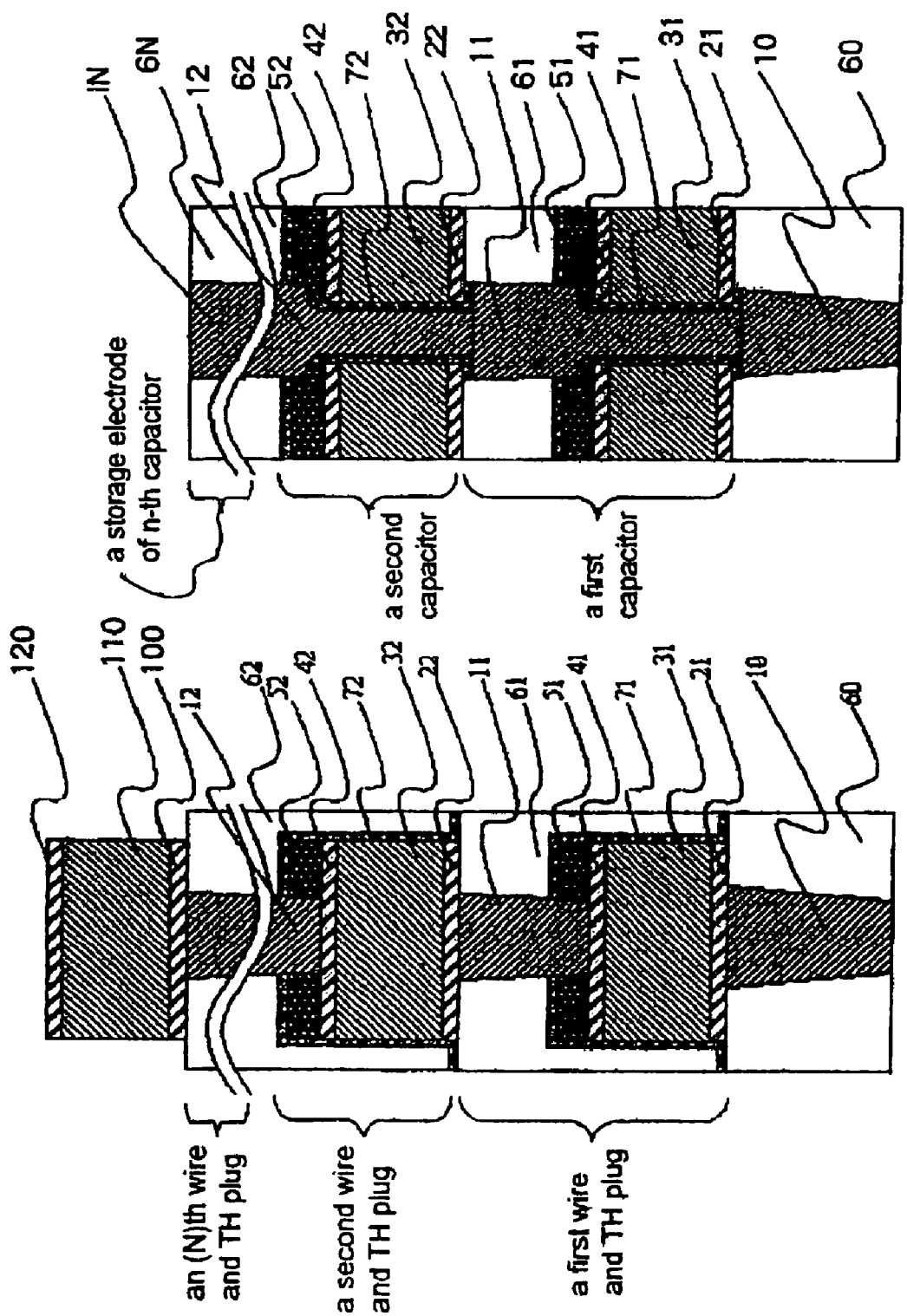

SEMICONDUCTOR DEVICE HAVING INCREASED CAPACITANCE OF CAPACITOR FOR DATA STORAGE AND METHOD OF MANUFACTURING SEMICONDUCTOR DEVICE

This application is based upon and claims the benefit of priority from Japanese Patent Application No. 2006-4827 filed on Jan. 12, 2006, the content of which is incorporated by reference.

BACKGROUND OF THE INVENTION

1. Field of the Invention

The present invention relates to a semiconductor device having electric capacitive elements for storing data, and a method of manufacturing thereof.

2. Description of the Related Art

Using a DRAM (Dynamic Random Access Memory) as an example of a semiconductor device having capacitors, conventional STC (Stacked Capacitor Cells) type DRAMs have accommodated reduction in electric capacitance of capacitors resulting from miniaturization by increasing the size of three-dimensional capacitors in a height direction in order to compensate for the reduced electric capacitance. This causes an increased aspect ratio in a cross-sectional direction of capacitors or causes complicated structures, leading to difficulties in simultaneously ensuring the capacitance of capacitors and the yield rate.

Specifically, the STC type DRAM involves such problems as a failure in ensuring the characteristic for embedding insulating films among capacitors and the characteristic for embedding conductive films, and peripheral circuit through holes positioned at levels higher than before for connecting upper and lower wires across the capacitors. These problems make it increasingly difficult to ensure the profile for embedding conductive films in through holes (see JP-A-2000-332213).

The capacitance of capacitors in a DRAM is designed to have approximately 25-35 [f Farad] in order to ensure resistance to data corruption such as soft errors. However, with the expansion of the DRAM market into electric appliance fields, there is a strong need to reduce the power consumption of some products, resulting in a pressing need for improving the refresh characteristic of DRAM memory cells.

While one secure solution for improving the refresh characteristics may involve increasing the capacitance of capacitors to increase signal amounts, the manufacturing process becomes complicated in order to increase the capacitance of the capacitor, causing costs to increase. On the other hand, a reduction in cost is also required, such as in the field of personal computers, so that there is a challenge to respond to these requirements when using the same manufacturing process. Further, while increasingly higher performance and functions are associated with requirements for an increase in the number of metal wiring layers, the challenge is how to limit increased costs.

A mixed device which has a Logic device and DRAM device involves an exclusive memory cell process added to a logic process, and includes the problems that higher costs cannot be avoid and a lower yield rate in comparison with the basic manufacturing process of only DRAM device or a Logic device.

SUMMARY OF THE INVENTION

It is an object of the present invention to provide a semiconductor device which reduces the need for a complicated manufacturing process and increases the capacitance of capacitors for storing data, and a method of manufacturing the same.

According to the present invention, a semiconductor device comprises a memory cell area having memory cells arranged in an array form, each memory cell including a capacitor for storing data; and a peripheral circuit area for accessing the memory cell area, and including a plurality of wiring layers, wherein each memory cell has a capacitor which is comprised of a plate electrode, a capacitive insulating film formed on a side wall of an opening formed through the plate electrode, and a storage electrode embedded in the opening in which the capacitive insulating film is formed on the side wall, such that the plate electrodes, the capacitive insulating films, and the storage electrodes of the memory cells are arranged in correspondence to the plurality of wiring layers, and the storage electrodes are connected to one another.

According to the present invention, a method of manufacturing a semiconductor device which has a memory cell area including a capacitor for storing data, and a peripheral circuit area for accessing the memory cell area, comprises: forming an underlying plug in the memory cell area in an underlying insulating film formed on a substrate for connection to the capacitor; forming a first wire in the peripheral circuit area on the underlying insulating film, and forming a plate electrode of a first capacitor on the underlying plug in the memory cell area; forming a first opening through the plate electrode to reach the underlying plug; etching an upper portion of the underlying plug by a predetermined amount; forming a capacitive insulating film which covers exposed surfaces of the first wire, the plate electrode, and the underlying plug; forming an inter-layer insulating film on the capacitive insulating film; etching the capacitive insulating film and the inter-layer insulating film through a mask disposed on the inter-layer insulating film to form a second opening for exposing part of the first wire, and removing the inter-layer insulating film within the first opening to expose part of the underlying plug on the bottom of the first opening; and embedding a conductive material in the first and second openings to form a plug in the peripheral circuit area for connection between wires and to form a storage electrode of the first capacitor in the memory cell area.

According to the present invention, a method of manufacturing a semiconductor device which has a memory cell area including a capacitor for storing data, and a peripheral circuit area for accessing the memory cell area, comprises: forming an underlying plug in the memory cell area in an underlying insulating film formed on a substrate for connection to the capacitor; forming a conductor and an insulating cap layer in sequence on the underlying insulating film; forming a first wiring pattern of the conductor and the insulating cap layer in the peripheral circuit area, and forming a plate electrode pattern for a first capacitor of the conductor and insulating cap layer on the underlying plug in the memory cell area; forming a first opening through the plate electrode to reach the underlying plug; etching an upper portion of the underlying plug by a predetermined amount; forming a capacitive insulating film which covers exposed surfaces of a first wire having the insulating cap layer, the plate electrode, and the underlying plug; forming an inter-layer insulating film on the capacitive insulating film; etching the capacitive insulating film and the inter-layer insulating film through a mask disposed on the inter-layer insulating film to form a second opening for exposing part of the first wire; etching the capacitive insulating film and the inter-layer insulating film through a mask disposed on the inter-layer insulating film, the mask having an opening, the dimensions of which are larger than the first opening, to remove the inter-layer insulating film within the first opening and to expose part of the underlying plug on the bottom of the first opening; and embedding a conductive material in the first and second openings to form a plug in the peripheral circuit area for. connection between wires and to form a storage electrode of the first capacitor in the memory cell area.

In the present invention, a capacitor is formed simultaneously with a wire of a peripheral circuit, and capacitors corresponding to wires are formed in a stack. Since the wire In the peripheral circuit is formed simultaneously with the capacitor in the memory cell area, the number of manufacturing steps can be reduced. Also, since stacked capacitors are connected through storage electrodes, the capacitance is increased in correspondence to the number of wiring layers.

Accordingly, the present invention can limit an increase in the number of steps in the manufacturing process, associated with an increase in the number of wiring layers, and can increase the capacitance of a capacitor in each memory cell.

The above and other objects, features and advantages of the present invention will become apparent from the following description with reference to the accompanying drawings which illustrate examples of the present invention.

BRIEF DESCRIPTION OF THE DRAWINGS

FIGS. 13A and 13B are cross-sectional schematic diagrams each illustrating an exemplary configuration of a semiconductor device according to a second embodiment;

DETAILED DESCRIPTION OF THE PREFERRED EMBODIMENT

A method of manufacturing a semiconductor device according to the present invention is characterized by forming a wire in a circuit and forming a plate electrode of a capacitor in a common step, and forming a plug for making connection between wires in the circuit and a storage electrode of the capacitor in a common step.

First Embodiment

Figures 1A, 1B:
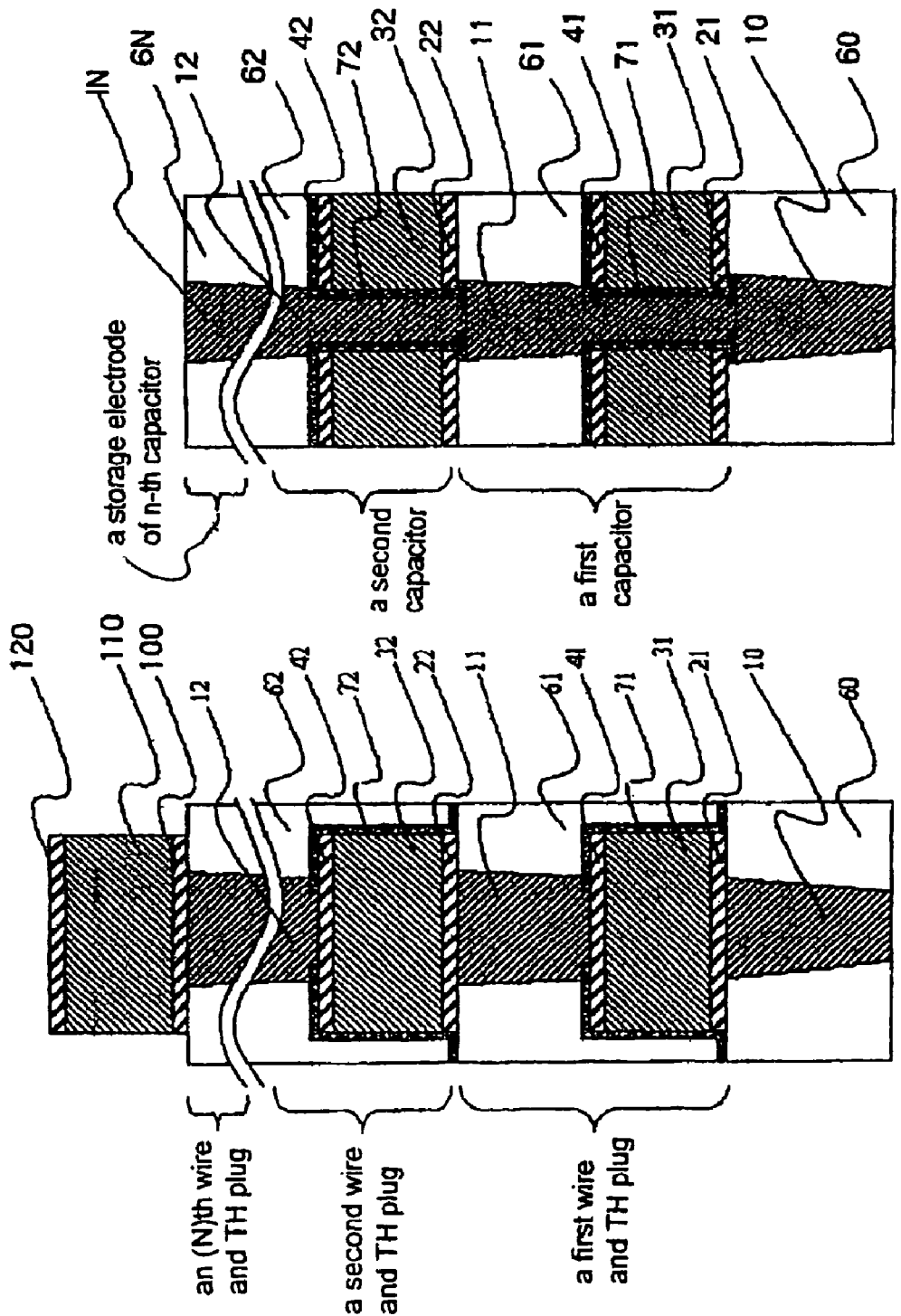
FIGS. 1A and 1B are cross-sectional schematic diagrams each illustrating an exemplary configuration of a semiconductor device according to a first embodiment.

The configuration of a semiconductor device according to a first embodiment will be described in connection with a DRAM. FIGS. 1A and 1B are cross-sectional views each illustrating an exemplary configuration of the semiconductor device according to this embodiment, where FIG. 1A illustrates a peripheral circuit area, and FIG. 1B illustrates a memory cell area. In the semiconductor device of this embodiment, a capacitor structure illustrated in FIG. 1B is fabricated simultaneously with a multi-layer wiring structure illustrated in FIG. 1A.

As illustrated in FIG. 1A, a multi-layer wire in the peripheral circuit area comprises a first wire, a second wire, . . . , an (N+1)th wire (N is a natural number equal to or larger than one), and throughhole plugs (hereinafter labeled "TH plugs") for connecting between wires. The first wire is made up of aluminum mixed with copper (hereinafter simply called "aluminum") 31, titanium nitride 21 which underlies aluminum 31, and titanium nitride 41 which overlies aluminum 31.

The second wire is made up of aluminum 32, titanium nitride 22 which underlies aluminum 32, and titanium nitride 42 which overlies aluminum 32. Similar to the first wire and the second wire, the (N+1)th wire is made up of aluminum 110, titanium nitride 100 which underlies aluminum 110, and titanium nitride 120 which overlies aluminum 110. Titanium nitrides 21, 22, 100 function as barrier layers, while titanium nitrides 41, 42, 120 function as cap layers.

Each of the first to N-th wires is covered with an insulating film on its sides and top, an opening is formed through the insulating film on the top. A TH plug is connected to an underlying wiring layer through the opening. That thing will be described below according to FIG. 1A. Plug 10, which serves as a TH plug, connects an underlying wiring layer (not shown) with titanium nitride 21 of the first wire. Plug 11 connects titanium nitride 41 of the first wire with titanium nitride 22 of the second wire through an opening of insulating film 71. Likewise, plug 12 connects the second wire with a third wire (not shown) through an opening of insulating film 72. In this way, each plug connects an overlying wiring layer with an underlying wiring layer up to the (N+1)th layer. Plugs 10, 11, 12 are mainly formed of an electrically conductive material which excels in embedding characteristics, such as tungsten.

The underlying layer (not shown) is disposed in inter-layer insulating film 60, while the first wire and plug 11 are disposed in inter-layer insulating film 61. The second wire and plug 12 in turn are disposed in inter-layer insulating film 62. Though not shown, elements such as transistors and wires have been formed on a layer which underlies inter-layer insulating film 60.

In the memory cell area illustrated. in FIG. 1B, a first capacitor and a second capacitor are stacked one on the other. Each capacitor comprises a plate electrode, a storage electrode, and an insulating film sandwiched between these two electrodes. This insulating film serves as a capacitive insulating film of the capacitor. The plate electrode of the first capacitor is made up of aluminum 31, titanium nitride 21 which underlies aluminum 31, and titanium nitride 41 which overlies aluminum 31. The storage electrode of the first capacitor is formed by plug 11. Insulating film 71 corresponds to the capacitive insulating film of the first capacitor. Plug 11 is connected to plug 10 which in turn is connected to a memory cell selecting transistor (not shown). Plug 10 is called the "underlying plug."

The plate electrode of the second capacitor is made up of aluminum 32, titanium nitride 22 which underlies aluminum 32, and titanium nitride 42 which overlies aluminum 32. The storage electrode of the second capacitor is formed by plug 12. Insulating film 72 corresponds to the capacitive insulating film of the second capacitor. Insulating films 71, 72 may be made, for example, of tantalum-pentoxide. Though not shown in FIG. 1B, a third to an n-th capacitor are stacked one on another above the second capacitor.

In comparing the first layer illustrated in FIG. 1A with the first capacitor illustrated in FIG. 1B, aluminum 31 and titanium nitrides 21, 41 make up the first wire in the peripheral circuit area, and make up the plate electrode of the first capacitor in the memory cell area. Insulating film 71 in turn serves to ensure the insulation of the first wire in the peripheral circuit area, and serves as a capacitive insulating film in the first capacitor. Then, plug 11 in the peripheral circuit area serves as a TH plug for connecting the first wire with the second wire, while plug 11 in the memory cell area serves as the storage electrode of the first capacitor.

In comparing the second wire with the second capacitor, aluminum 32 and titanium nitrides 22, 42 make up the second wire in the peripheral circuit area, and make up the plate electrode of the second capacitor in the memory cell area. Insulating film 72 in turn serves to ensure the insulation of the second wire in the peripheral circuit area, and serves as a capacitive insulating film in the second capacitor. Then, plug 12 in the peripheral circuit area serves as a TH plug for connecting the second wire with the third wire, while plug 12 in the memory cell area serves as the storage electrode of the second capacitor. In this way, when the second wire and second capacitor are compared with each other, the relationship of these is similar to the relationship of the first wire and first capacitor.

It should be noted that FIGS. 1A and 1B illustrate only wires formed simultaneously with the capacitors and overlying wires, and omit underlying semiconductor elements, such as transistors, and wiring layers which are not formed simultaneously with the capacitors. Also, any required number of wiring layers, which are not formed simultaneously with the capacitor, may be formed above the illustrated structure, as required.

Figure 2B:
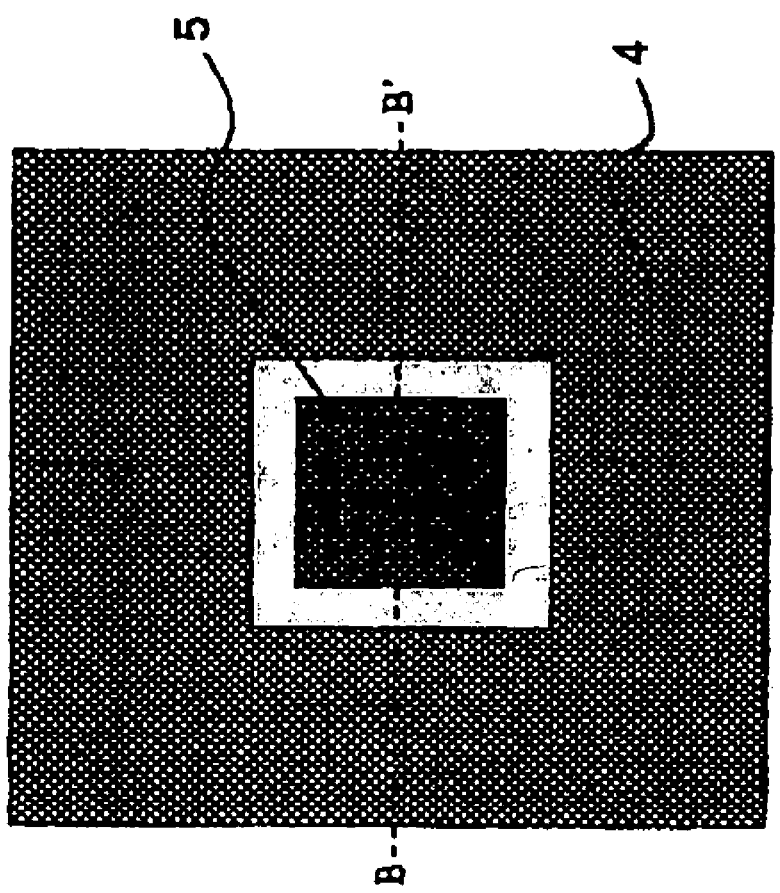
FIGS. 2A and 2B are top plan views each illustrating an exemplary layout of the semiconductor device according to the first embodiment.
Figure 2A:
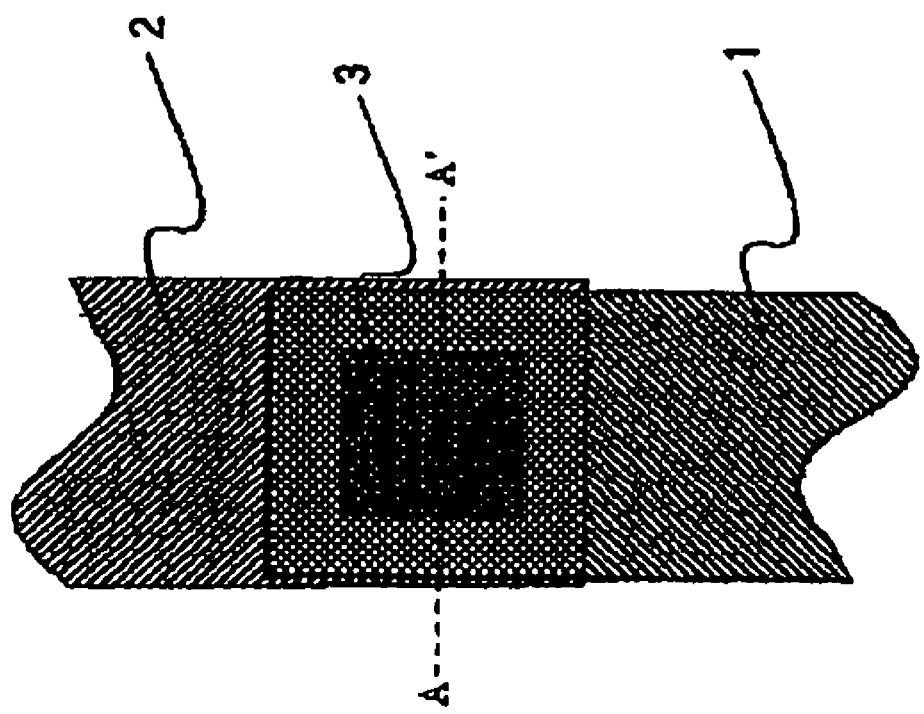

FIGS. 2A and 2B are top plan views each illustrating an exemplary layout of the semiconductor device according to the first embodiment. FIG. 2A illustrates a location at which a wire is connected to another wire in a peripheral circuit area, and FIG. 2B illustrates a single capacitor in a memory cell area. FIG. 2A illustrates wire 1, wire 2 which overlies wire 1, and TH plug 3 for connecting these wires 1, 2, all of which are superimposed on a layout in a top plan view. In this connection, a memory cell is generally composed of a data transfer transistor and a capacitor, but since the present invention relates to the structure of a capacitor in a memory cell, the transistor is omitted in the layout.

As illustrated in FIG. 2A, wire 1 and wire 2 are connected through TH plug 3. As illustrated in FIG. 2B, a capacitor is made up of storage electrode 5 for storing data, plate electrode 4 on which the base potential is applied to store data, and a capacitive, insulating film sandwiched between these two electrodes. While FIG. 2B illustrates a single capacitor, plate electrode 4 is common to a memory cell array. Wire 1 is formed simultaneously with plate electrode 4, while TH plug 3 is formed simultaneously with storage electrode 5 by a method, that will be described later.

As illustrated in FIG. 2B, plate electrode 4 is patterned such that it generally covers the memory cell array while having portions stamped out for forming storage electrodes 5 therein, and storage electrode 5 is disposed in the stamped-out portion as a hole pattern. The structure on a cross section taken along line A-A' in FIG. 2A corresponds to the place that the two wires are connected by TH plug in FIG. 1A, while the structure on a cross section taken along line B-B' corresponds to a capacitor area in FIG. 1B.

When there are three or more wiring layers in the peripheral circuit area, the resulting wiring pattern will overlap with wire 1 or wire 2, and TH plugs for connecting between wires will also overlap with the pattern of TH plug 3 illustrated in FIG. 2A. Accordingly, the layout illustrated in a top plan view of FIG. 2A is a representative diagram of the peripheral circuit area. While an actual wiring layout may have a variety of patterns and a plurality of TH plugs, instead of one, to connect wires, a detailed description thereof is omitted in this embodiment.

Also, when there are two or more layers of capacitors in the memory cell area, the layout pattern of plate electrode 4 and storage electrode 5 in each capacitor is similar to the pattern illustrated in FIG. 2B. Accordingly, even when there are two or more layers of capacitors, the layout illustrated in a top plan view of FIG. 2B represents the memory cell area. Also, while FIG. 2B illustrates a capacitor of a memory cell having information corresponding to one bit, capacitors are actually provided for any required number of bits in parallel with the capacitor illustrated in FIG. 2B in an array of a similar pattern, though not-shown.

Next, a description will be given of a method of manufacturing the semiconductor device according to this embodiment. FIGS. 3A and 3B through FIGS. 12A and 12B are cross-sectional schematic diagrams for describing the method of manufacturing the semiconductor device according to this embodiment. FIGS. 3A through 12A each illustrate part of the peripheral circuit area, while FIGS. 3B through 12B illustrate part of the memory cell area.

Semiconductor elements such as transistors, wiring layers which are not formed simultaneously with capacitors of memory cells, and an insulating film for insulating these elements (called the "underlying insulating film") and wiring layers have been previously formed on a semiconductor substrate. Subsequently, plugs 10 for connecting wiring layers, not shown, are formed of tungsten in inter-layer insulating film 60 in both the peripheral circuit area and memory cell area, respectively. Then, a conductive layer in a three-layer structure made up of titanium nitride 21, aluminum 31, and titanium nitride 41 is sequentially deposited by a sputtering method on plugs 10 and inter-layer insulating film 60.

Figures 3A, 3B:
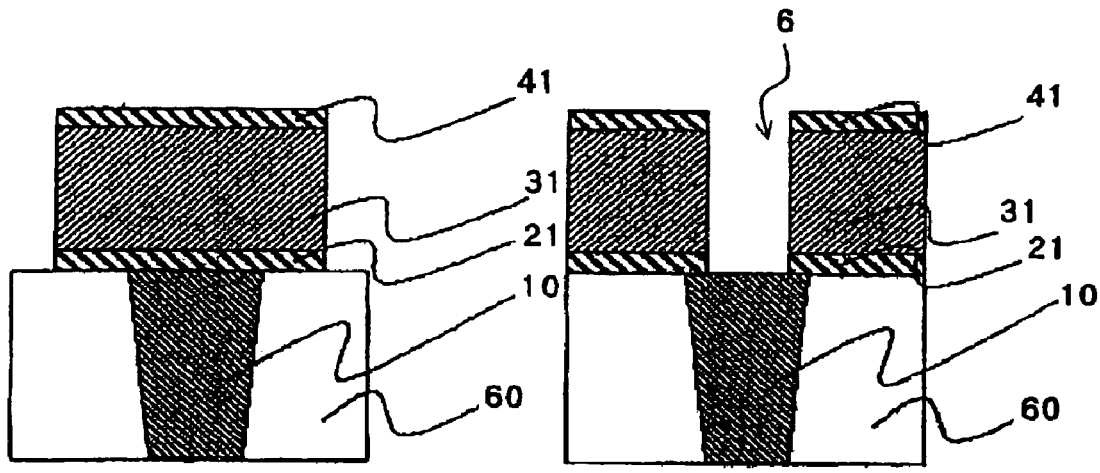
FIGS. 3A and 3B are cross-sectional views each illustrating the structure of the semiconductor device according to the first embodiment after a first wiring layer has been completed based on the method of manufacturing the semiconductor device.

Then, a resist having a predetermined opening pattern is formed on the conductive layer by a lithographic technique using a KrF laser. Next, the conductive layer is processed by a dry etching technique using the resist as a mask to form a first wiring pattern in the peripheral circuit area and to form a plate electrode pattern in the memory cell area. Subsequently, the resist is removed by a dry usher (FIGS. 3A and 3B). As illustrated in FIG. 3B, opening 6 is formed through the plate electrode of the memory cell area. The first wiring pattern corresponds to wire 1 shown in FIG. 2A, while the plate electrode pattern corresponds to plate electrode 4 shown in FIG. 2B.

Figures 4A, 4B:
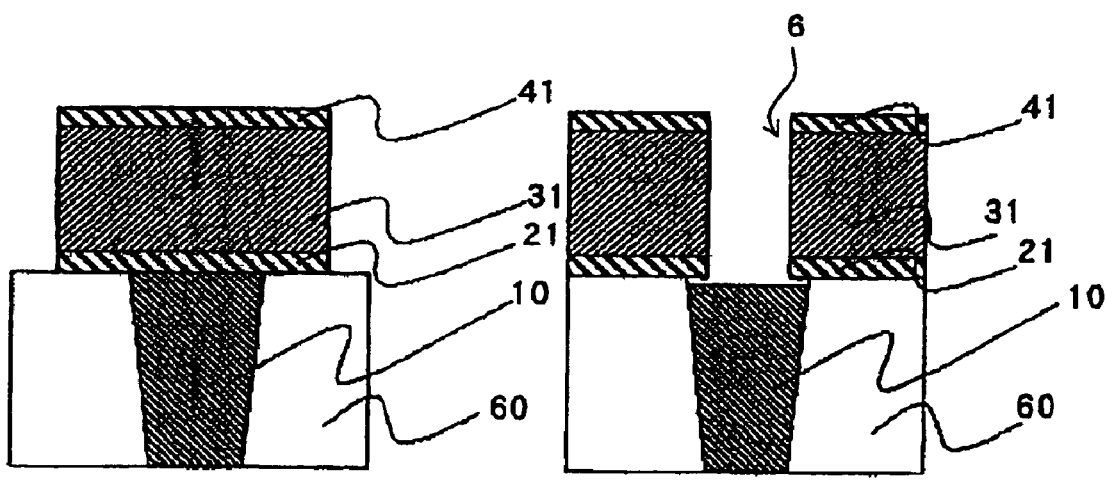
FIGS. 4A and 4B are cross-sectional views each illustrating the structure of the semiconductor device according to the first embodiment after an underlying plug has been etched based on the method of manufacturing the semiconductor device.

Next, the tungsten of plug 10 is etched based on an etching rate for titanium nitrides 21, 41 and aluminum 31 that is sufficiently high and based on isotropic etching. In this event, since plug 10 is covered with the first wire (titanium nitride 41/aluminum 31/tifanium nitride 21) in the peripheral circuit area, plug 10 is not etched (FIG. 4A). On the other hand, since tungsten plug 10 is exposed on the bottom of opening 6 formed through the plate electrode (titanium nitride 41/aluminum 31/titanium nitride 21), the top of plug 10 is etched (FIG. 4B).

Because of the creation of such a structure, the plate electrode (titanium nitride 41/aluminum 31/titanium nitride 21) is insulated from plug 10. As concerns the etch selectivity between plug 10 and the plate electrode, by increasing the etch selectivity between the tungsten of plug 10 and "titanium nitride 41/aluminum 31/titanium nitride 21" of the plate electrode, plug 10 can be etched from the top by a predetermined amount, while limiting the amount by which the plate electrode is etched.

Figures 5A, 5B:
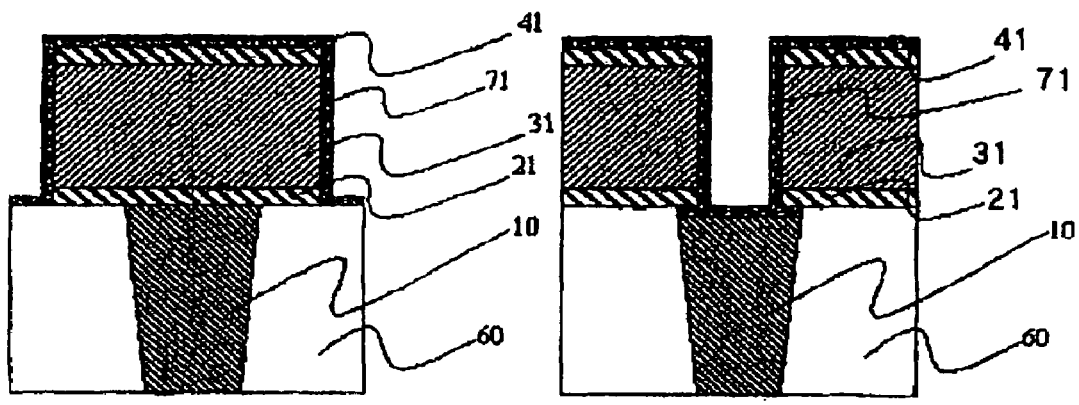
FIGS. 5A and 5B are cross-sectional views each illustrating the structure of the semiconductor device according to the first embodiment after a capacitive insulating film has been deposited based on the method of manufacturing the semiconductor device.

Next, tantalum pentoxide is deposited by a CVD (Chemical Vapor Deposition) method to form insulating film 71. In the peripheral circuit area, the first wire is covered with insulating film 71. on its sides and top (FIG. 5A). In the memory cell area, the top of plug 10, a side wall of opening 6, and the top of the plate electrode are covered with insulating film 71 (FIG. 5B). This insulating film 71 serves as a capacitive insulating film for the capacitor in the memory cell area.

Figures 6A, 6B:
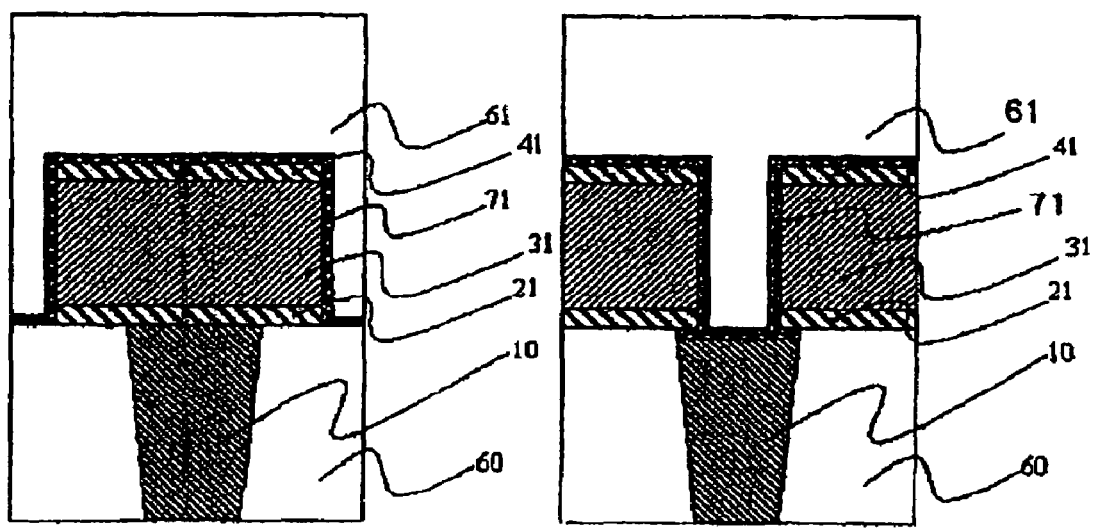
FIGS. 6A and 6B are cross-sectional views each illustrating the structure of the semiconductor device according to the first embodiment after a first inter-layer film has been completed based on the method of manufacturing the semiconductor device.
Figure 7A:
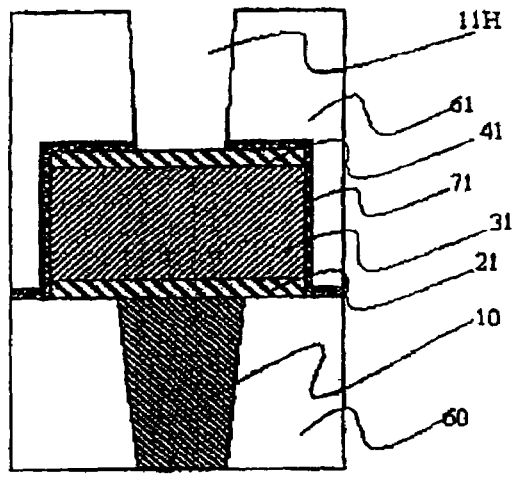
FIGS. 7A and 7B are cross-sectional views each illustrating the structure of the semiconductor device according to the first embodiment after a throughhole has been formed through the first wiring layer based on the method of manufacturing the semiconductor device.
Figure 7B:
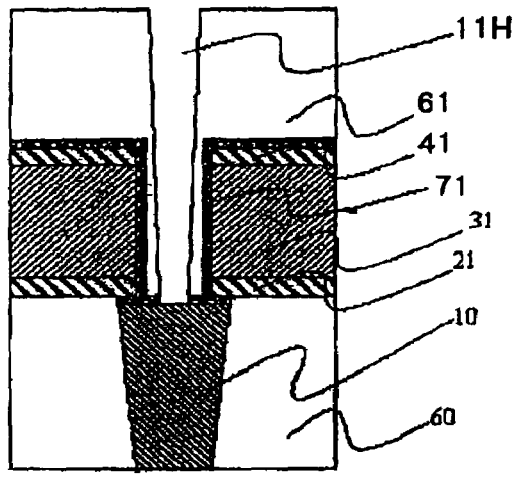

Next, as illustrated in FIGS. 6A and 6B, inter-layer insulating film 61 is deposited on insulating film 71 by a CVD method. Subsequently, a resist having a predetermined opening pattern is formed on inter-layer insulating film 61 by a lithographic technique. Then, inter-layer insulating film 61 and insulating film 71 are sequentially etched by an anisotropic dry etching technique using the resist as a mask. In this way, opening 11H is formed (FIG. 7A) for connecting titanium nitride 41 of the first wire to the TH plug in the peripheral circuit area, and opening 11H is formed (FIG. 7B) for connecting plug 10 to the storage electrode of the first capacitor in the memory cell area.

Figure 8A:
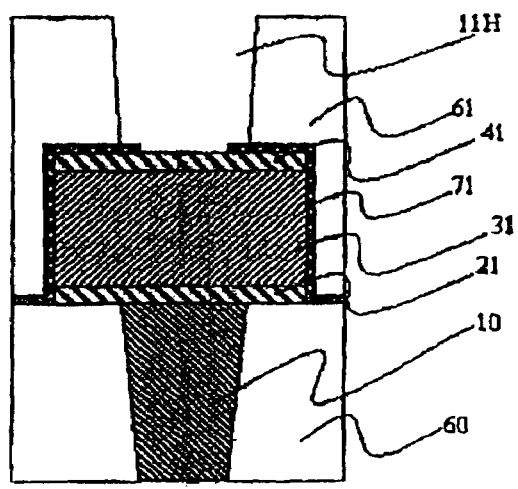
FIGS. 8A and 8B are cross-sectional views each illustrating the structure of the semiconductor device according to the first embodiment after the throughhole has been expanded in the first wiring layer based on the method of manufacturing the semiconductor device.
Figure 8B:
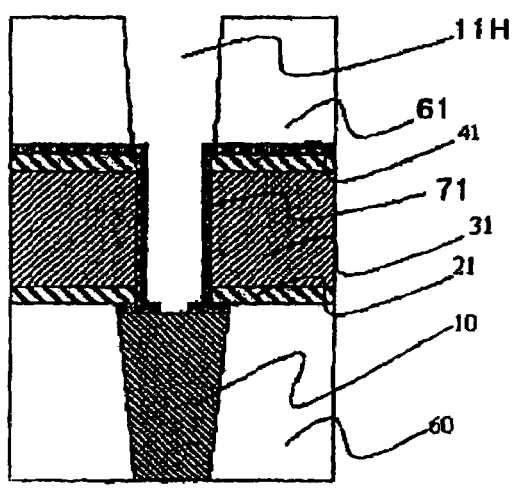

Next, opening 11H is isotopically expanded by wet etching using dilute fluoric acid or the like for purposes of exposing insulating film 71 on the side wall of the plate electrode in the memory cell area. In this way, an opening is formed for a TH plug in the peripheral circuit area (FIG. 8A), while an opening is formed for the storage electrode of the first capacitor in the memory cell area (FIG. 8B).

Figures 9A, 9B:
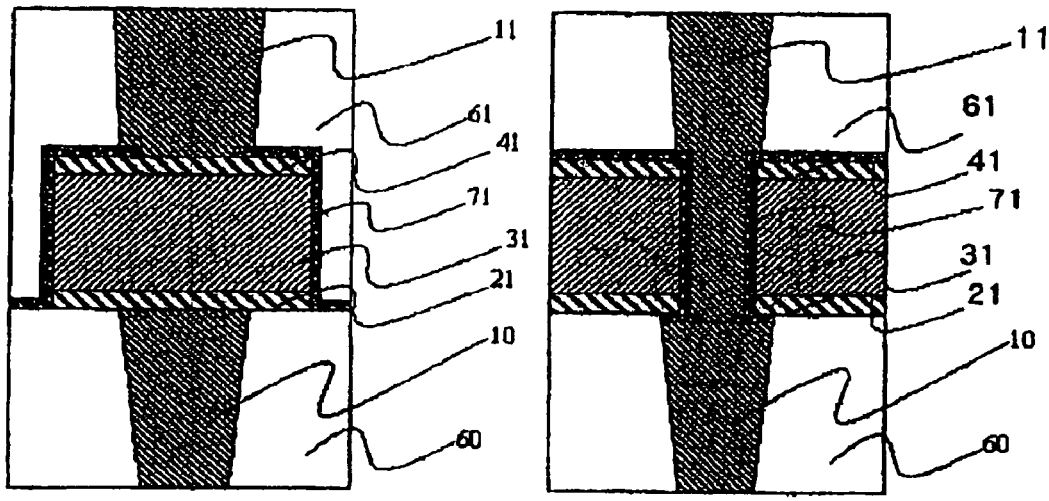
FIGS. 9A and 9B are cross-sectional views each illustrating the structure of the semiconductor device according to the first embodiment after an embedded plug has been formed in the throughhole of the first wiring layer based on the method of manufacturing the semiconductor device.

Next, after embedding a conductive film such as tungsten in opening 11H, the conductive film on inter-layer insulating film 61 is removed by a CMP (Chemical and Mechanical Polishing) technique. In this way, plug 11 is formed to serve as a TH plug in the peripheral circuit area (FIG. 9A) while plug 11 is formed to serve as the storage electrode of the first capacitor in the memory cell area (FIG. 9B). The conductive film for forming plug 11 is not limited to CVD-based tungsten, but plug 11 may be made of titanium nitride using a CVD method, or a laminate layer made up of both materials. As illustrated in FIG. 9B, the first capacitor is three-dimensionally formed by plug 11 corresponding to the storage electrode, insulating film 71 corresponding to the capacitive insulating film, and the plate electrode (titanium nitride 41/aluminum 31/titanium nitride 21) in the memory cell area.

Further, by repeating the manufacturing process described in connection with FIGS. 3A and 3B through 9A and 9B, a second wire and second capacitor are simultaneously formed, as illustrated in FIGS. 10A and 10B through 12A and 12B. A procedure of forming the second wire and second capacitor will be described in brief.

Figures 10A, 10B:
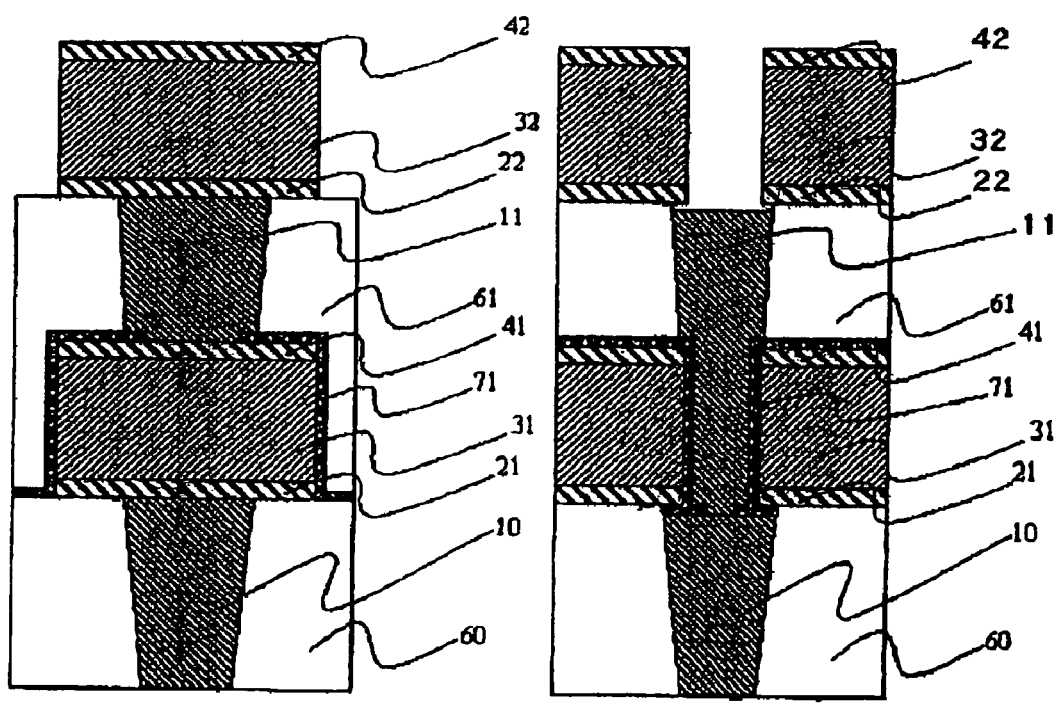
FIGS. 10A and 10B are cross-sectional views each illustrating the structure of the semiconductor device according to the first embodiment after a second wiring layer has been completed and an underlying plug has been etched based on the method of manufacturing the semiconductor device.
Figures 11A, 11B:
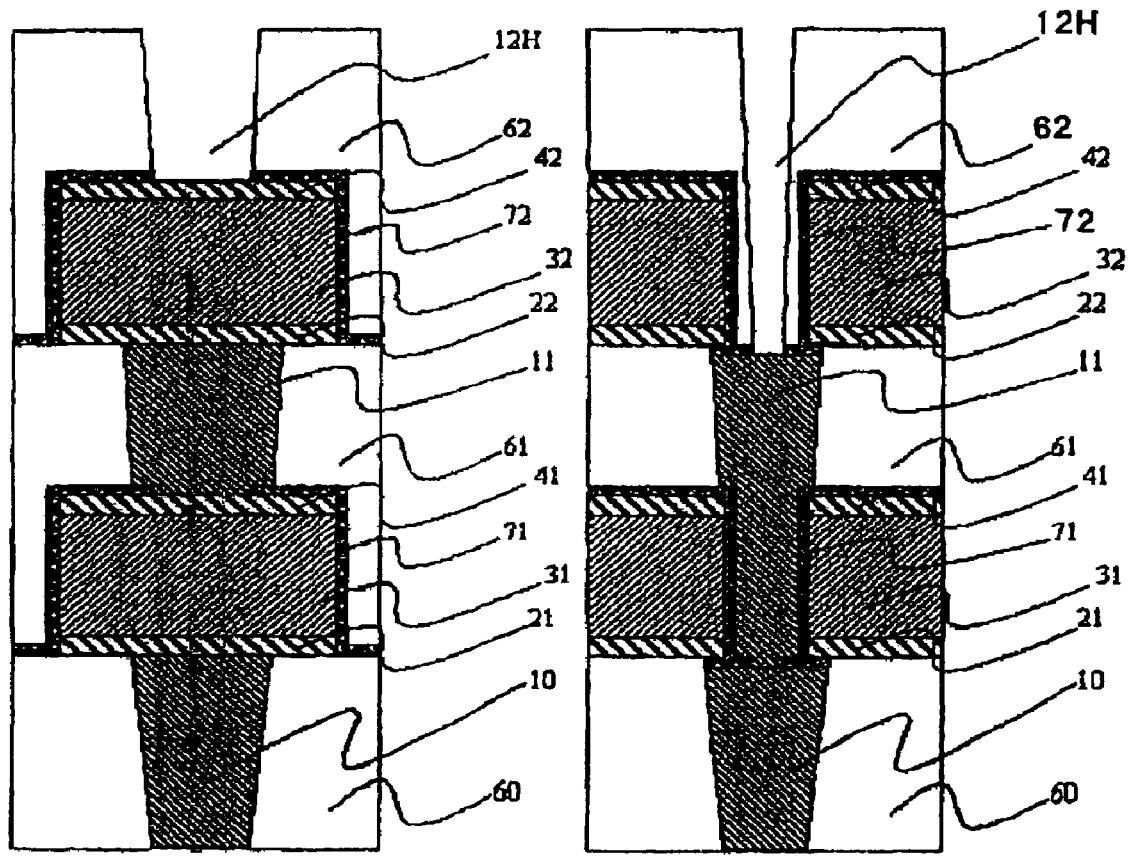
FIGS. 11A and 11B are cross-sectional views each illustrating the structure of the semiconductor device according to the first embodiment after a throughhole has been formed through the second wiring layer based on the method of manufacturing the semiconductor device.
Figures 12A, 12B:
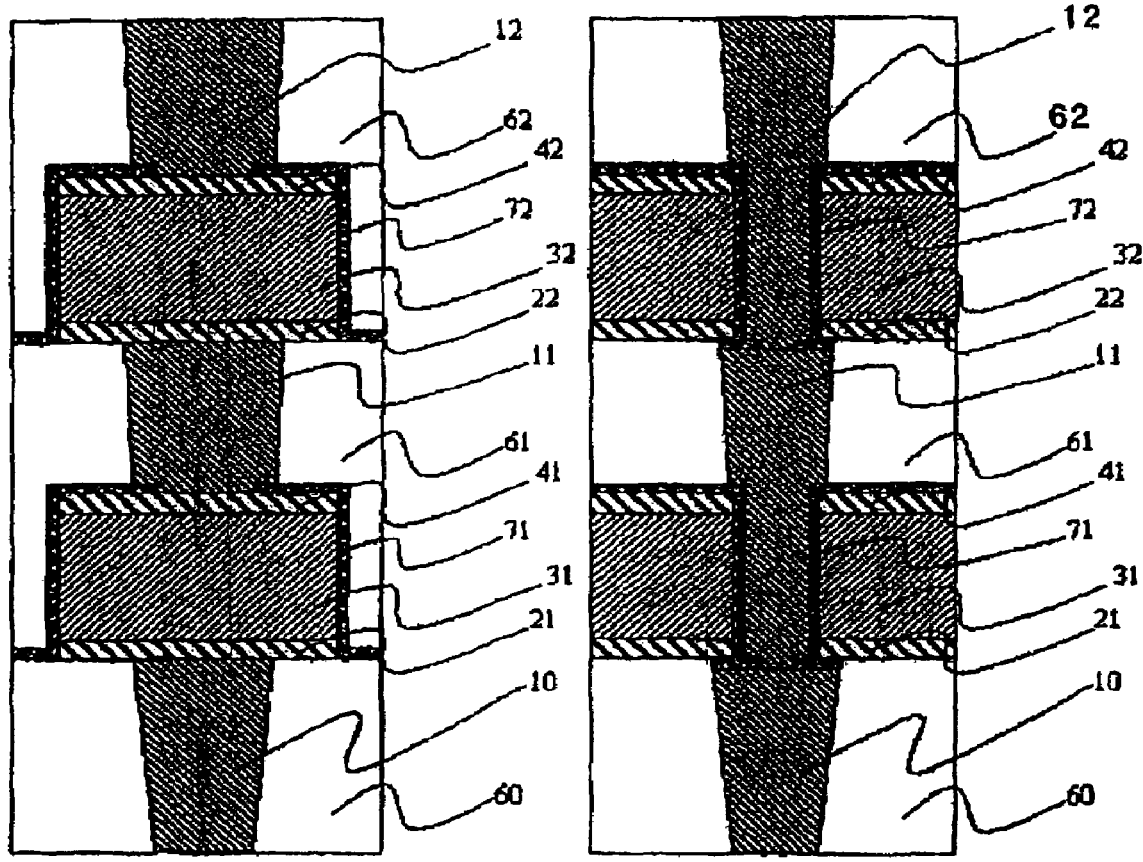
FIGS. 12A and 12B are cross-sectional views each illustrating the structure of the semiconductor device according to the first embodiment after an embedded plug has been formed in the throughhole of the second wiring layer based on the method of manufacturing the semiconductor device.

After the second wire and a plate electrode of the second capacitor are formed on inter-layer insulating film 61, an opening is formed through the plate electrode in a manner similar to the method described in connection with FIGS. 4A and 4B to insulate plug 11 from the plate electrode (FIGS. 10A and 10B). After the formation of insulating film 72 and inter-layer insulating film 62, openings 12H are formed through these two layers of insulating films in the peripheral circuit area and memory cell area in a manner similar to the method described in connection with FIGS. 7A and 7B (FIGS. 11A and 11B). Then, openings 12H are expanded in a manner similar to the method described in connection with FIGS. 8A and 8B, and a conductive film is embedded in openings 12H. In this way, plug 12 is formed to serve as a TH plug in the peripheral circuit area (FIG. 12A) while plug 12 is formed to serve as a storage electrode of the second capacitor in the memory cell area (FIG. 12B).

In this way, the first wire in the peripheral circuit area is formed simultaneously with the first capacitor in the memory cell area. Also, the second wire and second capacitor, which have similar structures to the first wire and first capacitor, are formed simultaneously on the first wire and first capacitor, respectively.

Next, a number of capacitors required in the memory cell are sequentially formed using the method described above. Then, the simultaneous formation of capacitors and wires, when completed, is followed by the formation of wires (titanium nitride 100/aluminum 110/titanium nitride 120) which are not formed simultaneously with the capacitor. Subsequently, overlying wiring layers and passivation films, not shown, are formed, as required, to fabricate a semiconductor device.

In the foregoing manner, plugs 10, 11 are formed simultaneously in both the peripheral circuit area and memory cell area, where each of plugs 10, 11 connects the first wire or second wire to a wiring layer within the underlying insulating film in the peripheral circuit area. The memory cell area, on the other hand, is formed with a structure in which plugs 10, 11 are insulated from the plate electrode which corresponds to wires in the peripheral circuit area by insulating films 71, 72.

The capacitive insulating film, which is not formed according to the conventional wiring process, is disposed on the first wire and second wire in the peripheral circuit area, whereas in the memory cell area, the plate electrode formed simultaneously with the wire in the peripheral circuit area, is in contact with the storage electrode and the underlying storage electrode formed simultaneously with the plugs in the peripheral circuit area through the capacitive insulating film, thus resulting in simultaneous formation of the wires in the peripheral circuit area and the capacitor in the memory cell area.

The method of manufacturing the semiconductor device according to the present invention can limit an increase in the number of steps in the manufacturing process, associated with an increase in the number of wiring layers, and increase the capacitance of a capacitor in each memory cell.

Also, conventionally, a cylinder having a high aspect ratio must be formed in order to provide a capacitor having a large capacitance. In this event, throughholes must be formed for a peripheral circuit to connect upper and lower wires across a capacitor. On the other hand, the present invention does not require such an ultra-high aspect ratio etching technique and a deposition technique that supports the ultra-high aspect ratio, which constitute factors for increasing the cost, and therefore substantially eliminates the need for dedicated materials and processes for these techniques, thus making it possible to achieve a lower cost than in the prior art.

In addition, the process of forming the wire and capacitor in the present invention can be repeated as a module for forming the wire and capacitor, where the required number (=Nm) of wiring layers and number (=Nc) of capacitor layers can be arbitrarily selected within the range of Nm>Nc. Accordingly, sufficient capacitance, which has been reduced due to miniaturization, can be assured by increasing the number (=Nc) of capacitor layers instead of increasing the height of the capacitors. This results in a limited increase in the aspect ratio of the capacitor in the vertical direction with respect to the substrate surface, elimination of the need for processing capacitors having a high aspect ratio, and an improved yield rate.

Second Embodiment

A method of manufacturing a semiconductor device according to a second embodiment enables a hole pattern for a storage electrode of a capacitor to be formed in a self-aligning patterrning method by forming an insulating cap layer which functions as an etching mask on a plate electrode in a memory cell area.

A description will be given of the configuration of the semiconductor device according to this embodiment. FIGS. 13A and 13B are cross-sectional schematic diagrams each illustrating an exemplary configuration of the semiconductor device according to this embodiment. FIG. 13A illustrates a peripheral circuit area, and FIG. 13B illustrates a memory cell area. Since the layout in a top plan view is similar to that illustrated in FIGS. 2A and 2B described in the first embodiment, a detailed description of the layout is omitted here.

As illustrated in FIG. 13A, in the peripheral circuit area, insulating cap layer 51 is formed on the top of a first wire which has titanium nitride 21, aluminum 31, and titanium nitride 41 laminated in this order. Plug 11, which functions as a TH plug for connecting wires to each other, is connected to the first wire through an opening formed through insulating film 71 and insulating cap layer 51. The foregoing structure is also employed in a second wire which has titanium nitride 22, aluminum 32, and titanium nitride 42 laminated in this order.

As illustrated in FIG. 13B, in the memory cell area, insulating cap layer 51 is formed on the top of a plate electrode of a first capacitor which has titanium nitride 21, aluminum 31, and titanium nitride 41 laminated in this order. Plug 11, which functions as a storage electrode, is connected to the plate electrode through an opening formed through insulating film 71 and insulating cap layer 51. The foregoing structure is also employed in a plate electrode of a second capacitor, which has titanium nitride 22, aluminum 32, and titanium nitride 42 laminated in this order.

Next, a description will be given of a method of manufacturing the semiconductor device according to this embodiment. FIGS. 14A and 14B through 24A and 24B are cross-sectional schematic diagrams for describing the method of manufacturing the semiconductor device according to this embodiment. For steps similar to those in the first embodiment, a detailed description thereof is omitted.

In a manner similar to the first embodiment, semiconductor elements such as transistors, wiring layers which are not formed simultaneously with capacitors of memory cells, and an under-lying insulating film for insulating these elements and a wiring layer have been previously formed on a semiconductor substrate. Subsequently, plugs 10 for connecting wiring layers, not shown, are formed of tungsten in inter-layer insulating film 60 in both the peripheral circuit area and memory cell area, respectively. Then, a conductive layer in a three-layer structure made up of titanium nitride 21, aluminum 31, and titanium nitride 41 is sequentially deposited by a sputtering method on plugs 10 and inter-layer insulating film 60. Further, in this embodiment, insulating cap layer 51 is formed on titanium nitride 41.

Figures 14A, 14B:
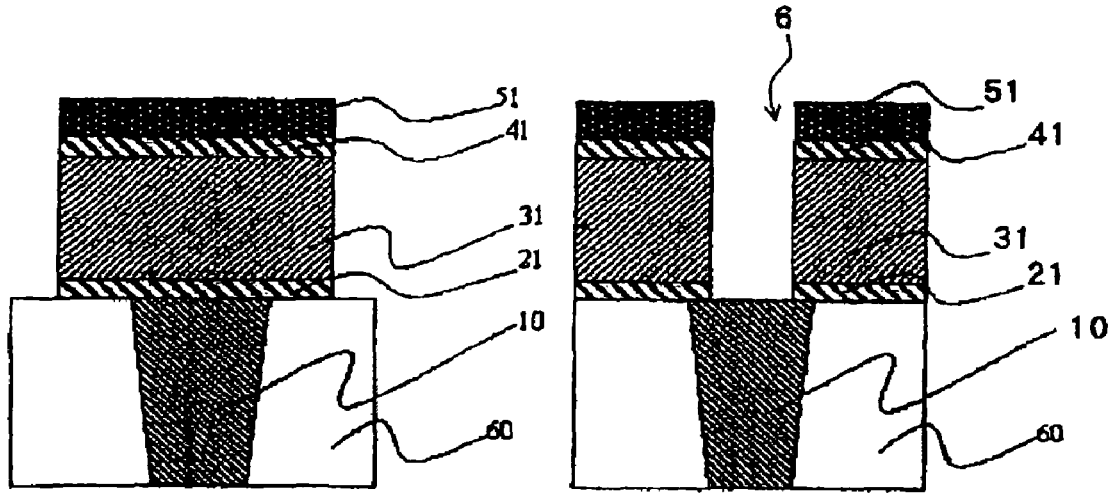
FIGS. 14A and 14B are cross-sectional views each illustrating the structure of the semiconductor device according to the second embodiment after a first wiring layer has been completed based on the method of manufacturing the same.
Figures 15A, 15B:
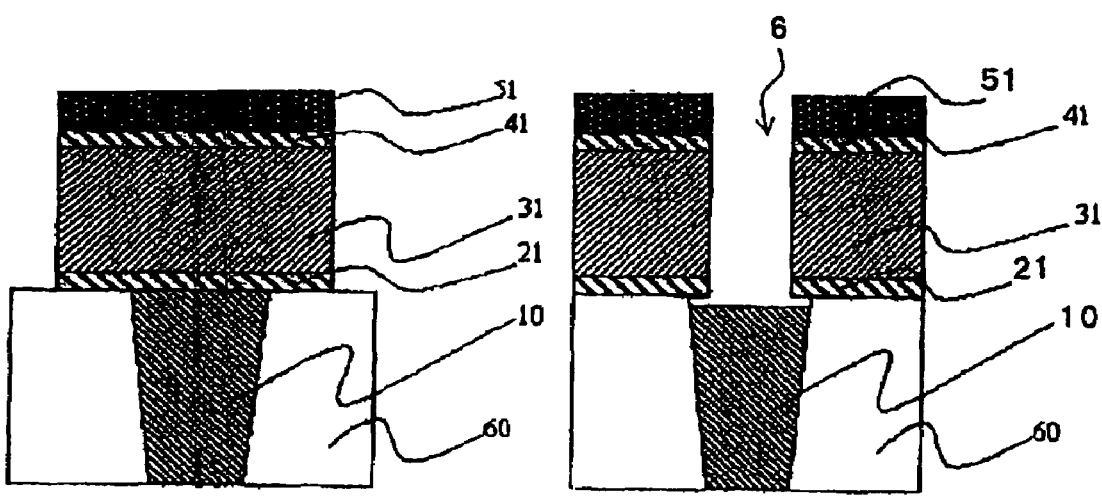
FIGS. 15A and 15B are cross-sectional views each illustrating the structure of the semiconductor device according to the second embodiment after an underlying plug has been etched based on the method of manufacturing the semiconductor device.
Figure 16A:
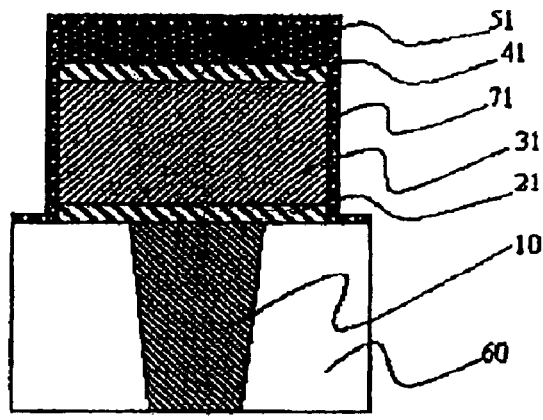
FIGS. 16A and 16B are cross-sectional views each illustrating the structure of the semiconductor device according to the second embodiment after a capacitive insulating film has been deposited based on the method of manufacturing the semiconductor device.
Figure 16B:
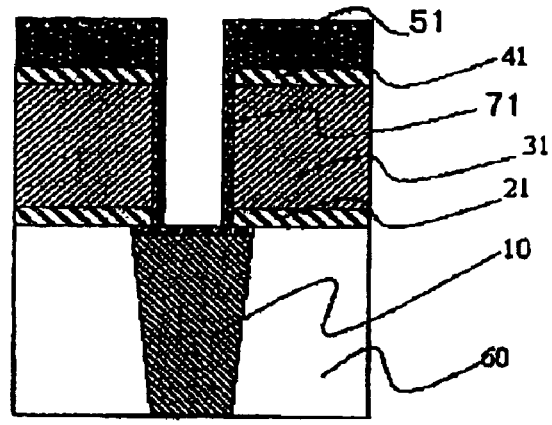
Figure 17A:
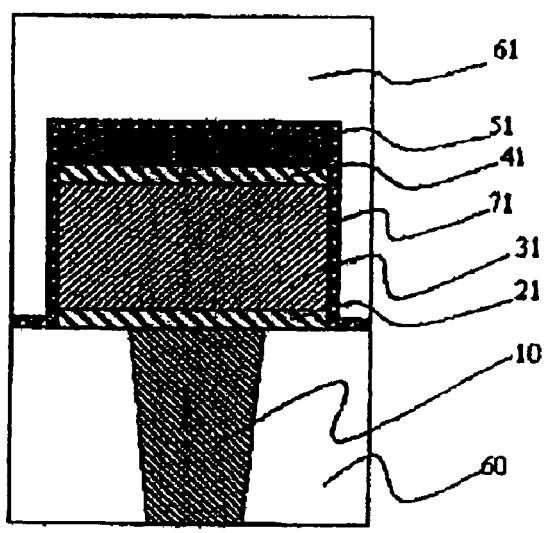
FIGS. 17A and 17B are cross-sectional views each illustrating the structure of the semiconductor device according to the second embodiment after a first inter-layer film has been completed based on the method of manufacturing the semiconductor device.
Figure 17B:
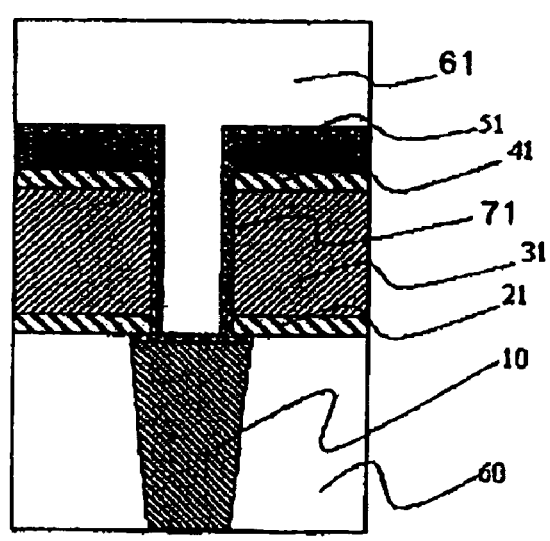
Figures 18A, 18B:
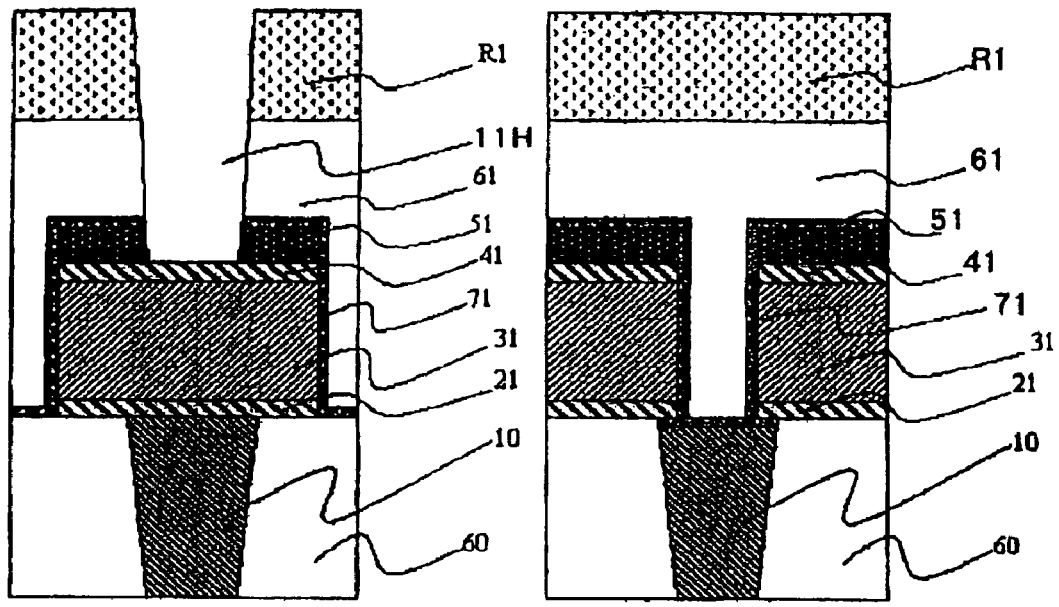
FIGS. 18A and 18B are cross-sectional views each illustrating only the structure of a peripheral circuit area of the semiconductor device according to the second embodiment after a throughhole has been formed through the first wiring layer based on the method of manufacturing the semiconductor device.

Next, as illustrated in FIG. 14B, an opening is formed through a conductive layer in the memory cell area using a photolithographic technique and: an etching technique. Subsequently, an upper portion of plug 10 is etched by a predetermined amount (FIG. 15B), insulating layer 71 is formed over the entire surface (FIGS. 16A and 16B), and inter-layer insulating film 61 is formed (FIGS. 17A and 17B) in a manner similar to the first embodiment. Then, opening 11H is formed through insulating film 71 and inter-layer insulating film 61 on the first wire in the peripheral circuit area using resist R1 as a mask (FIG. 18A).

Figures 19A, 19B:
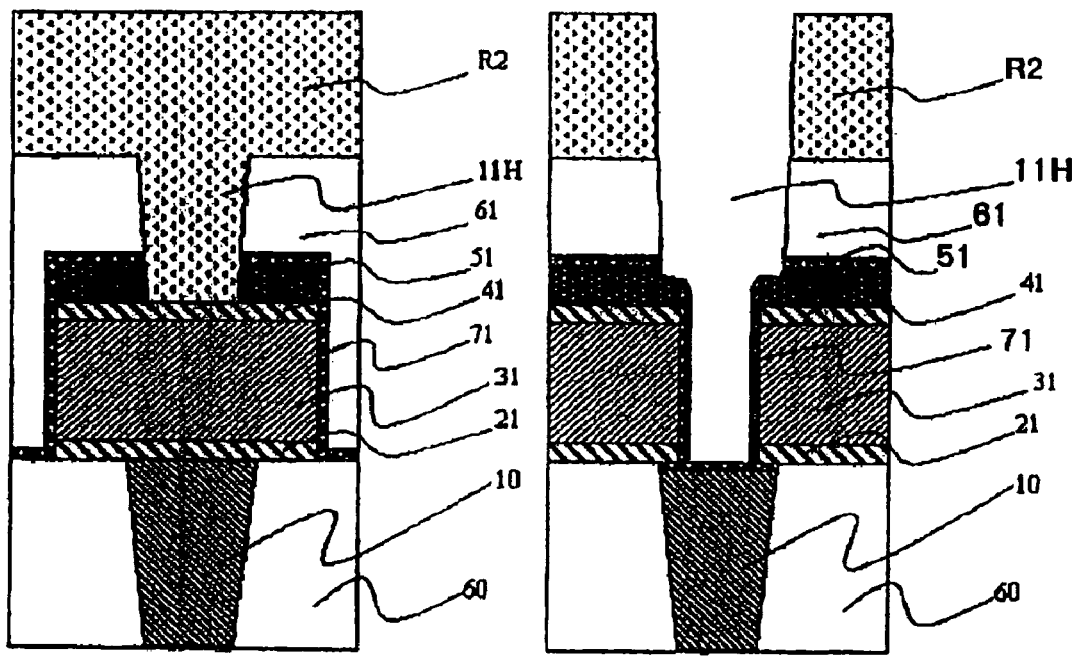
FIGS. 19A and 19B are cross-sectional views each illustrating the structure of the semiconductor device according to the second embodiment after a throughhole for storage capacitance has been formed through a first capacitor layer in the memory cell area based on the method of manufacturing the semiconductor device.
Figure 20A:
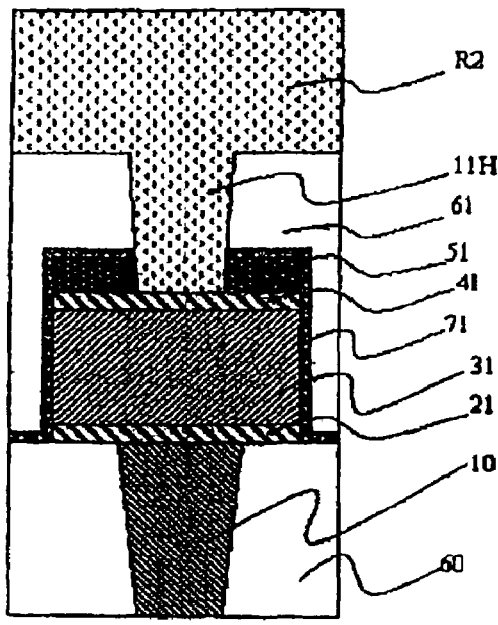
FIGS. 20A and 20B are cross-sectional views each illustrating the structure of the semiconductor device according to the second embodiment after a capacitive insulating film has been etched on the bottom of the throughhole in the first capacitor layer in the memory cell area based on the method of manufacturing the semiconductor device.
Figure 20B:
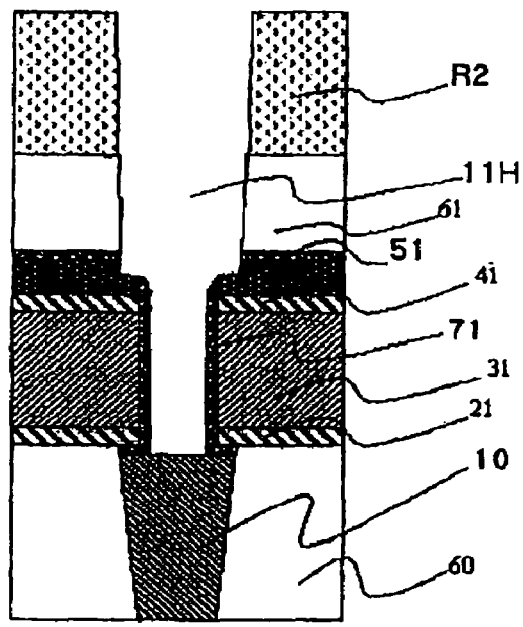

After removing resist R1, resist R2 is formed on inter-layer insulating film 61. As illustrated in FIG. 19B, inter-layer insulating film 61 in the memory cell area is etched using resist R2 as a mask. Resist R2 has an opening, the size of which is larger than opening 6. In a step illustrated in FIG. 19B, inter-layer insulating film 61 in opening 11H is etched in a self-aligning patterning method even if the opening of resist R2 has a size larger than opening 6, provided that inter-layer insulating film 61 is etched by an amount larger than insulating film 71 and insulating cap layer 51. In this way, a hole pattern for the storage electrode is formed in a self-aligning patterning method.

Figure 21A:
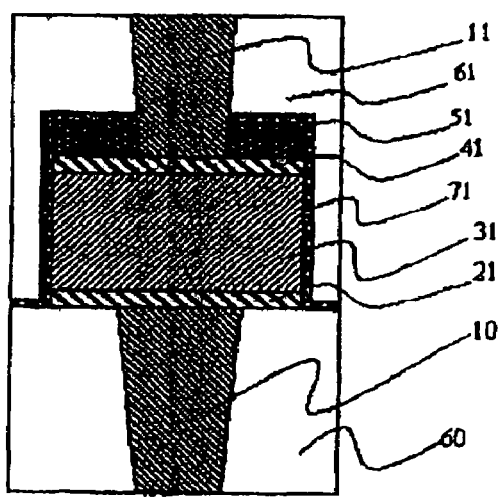
FIGS. 21A and 21B are cross-sectional views each illustrating the structure of the semiconductor device according to the second embodiment after an embedded plug has been formed in the throughhole of the first layer based on the method of manufacturing the semiconductor device.
Figure 21B:
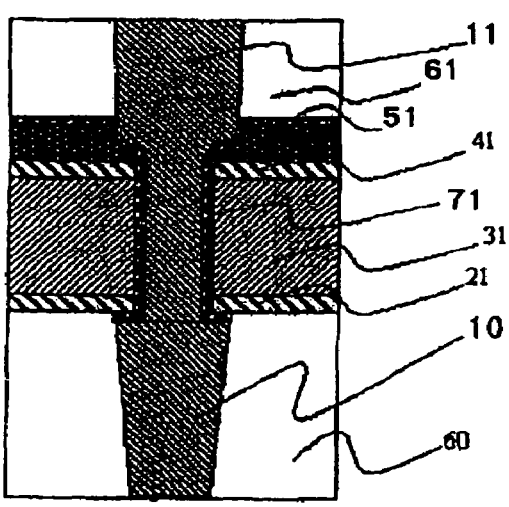
Figures 22A, 22B:
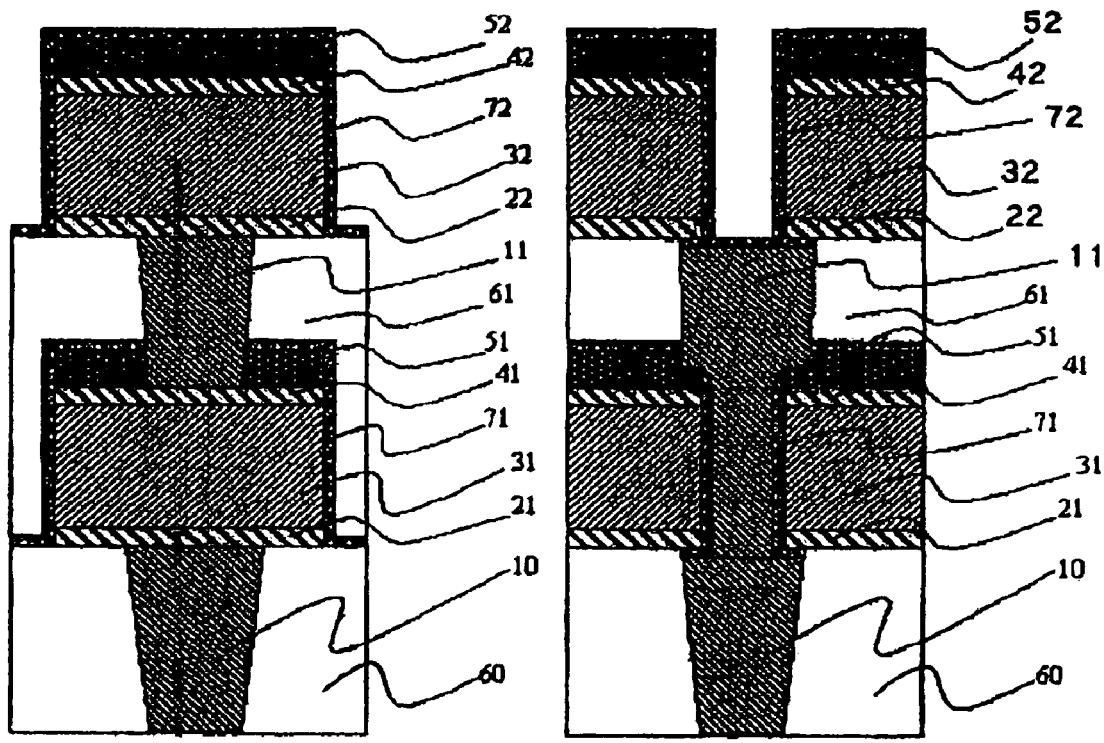
FIGS. 22A and 22B are cross-sectional views each illustrating the structure of the semiconductor device according to the second embodiment after a second wiring layer has been completed and a capacitive insulating film has been deposited based on the method of manufacturing the semiconductor device.
Figure 23A:
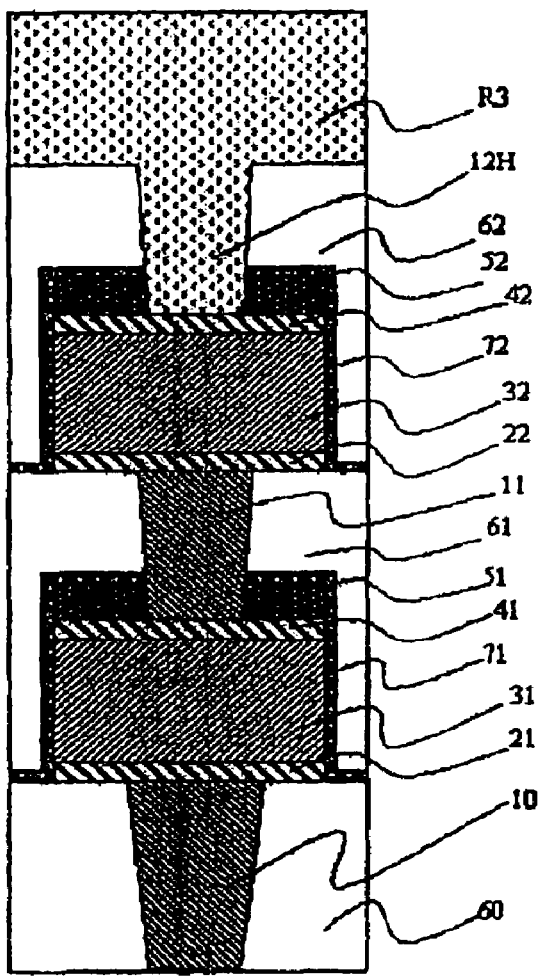
FIGS. 23A and 23B are cross-sectional views each illustrating the structure of the semiconductor device according to the second embodiment after a throughhole for storage capacitance has been formed through a second capacitor layer in the memory cell area based on the method of manufacturing the semiconductor device.
Figure 23B:
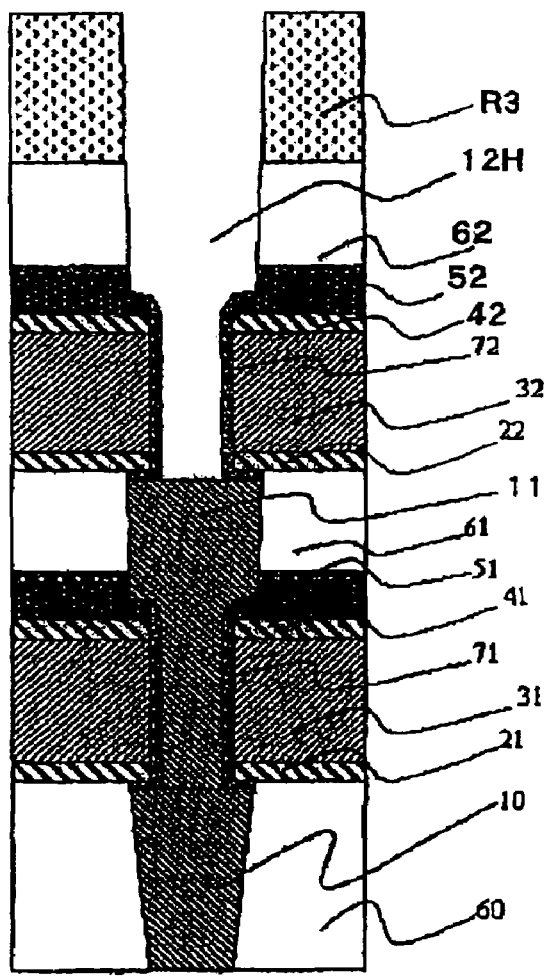
Figure 24A:
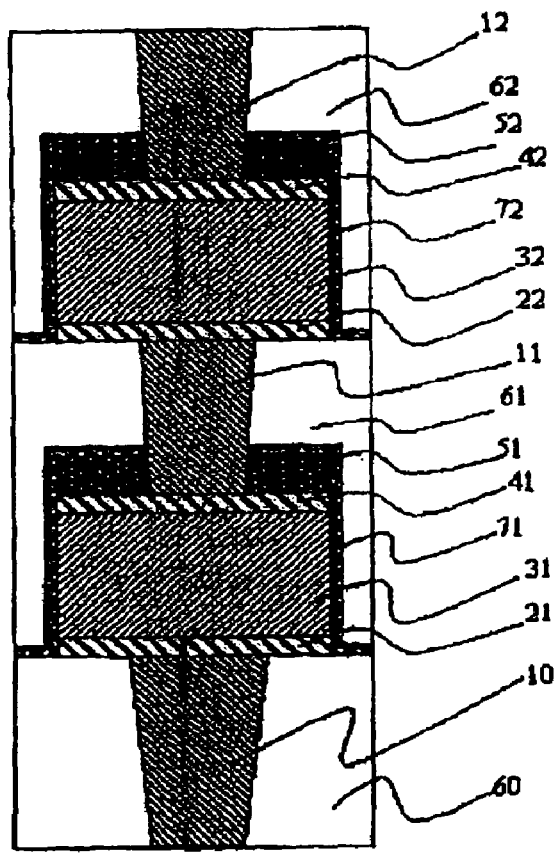
FIGS. 24A and 24B are cross-sectional views each illustrating the structure of the semiconductor device according to the second embodiment after an embedded plug has been formed in the throughhole in the second capacitor layer in the memory cell area based on the method of manufacturing the semiconductor device.
Figure 24B:
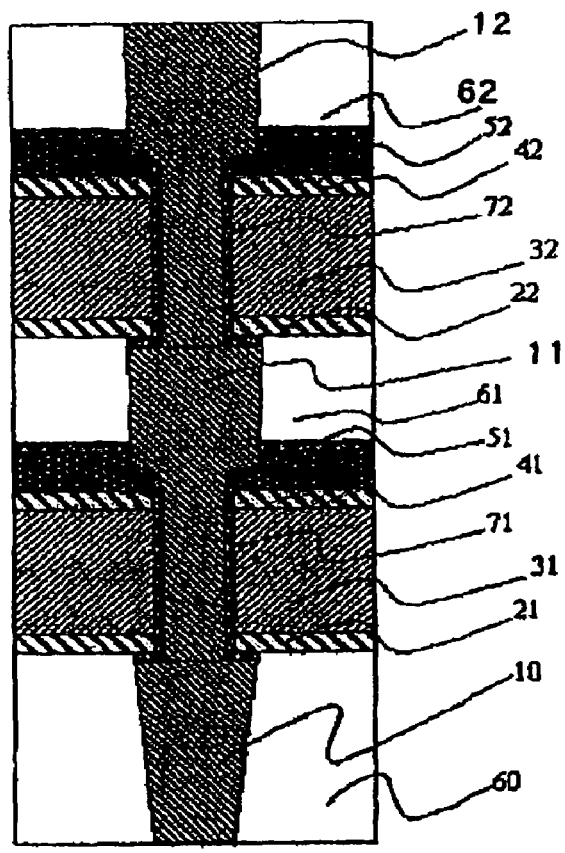

Subsequently, an opening is formed through insulating film 71 on plug 10 in the memory cell area. Then, a conductive film is embedded in openings 11H in the peripheral circuit area and memory cell area in a manner similar to the first embodiment. In this way, plug 11 which serves as a TH plug is formed in the peripheral circuit area (FIG. 21A), while plug 11 which serves as a storage electrode is formed in the memory cell area (FIG. 21B).

Further, after repeating the steps described in connection with FIGS. 14A and 14B through FIGS. 21A and 21B, and forming a hole pattern for a storage electrode of a second capacitor in a self-aligning patterning method using resist R3 shown in FIG. 23B as a mask, plug 12 is formed (FIGS. 22A and 22B through 24A and 24B). Subsequently, the foregoing method is repeated when the number of wiring layers and capacitors are increased.

Then, when a wire is simply formed in the peripheral circuit area, the wire (titanium nitride 100/aluminum 110/titanium nitride 120) is formed in a manner similar to the first embodiment, and an upper wiring layer and a passivation film, not shown, are formed, as required, to fabricate a semiconductor device.

In this embodiment, since the storage electrode can be processed in a self-aligning patterning method with respect to the plate electrode in the memory cell area, the memory cell can be made more compact than in the first embodiment. Thus, the semiconductor device according to the second embodiment can be reduced in size and have an increased capacitance, as compared with the first embodiment. Stated another way, the surface area of the capacitor can be expanded if the memory cell has a similar size to that of the first embodiment. A reduction in size and an increase in capacitance of a chip are effective in reducing the cost, and-the increased surface area of the capacitor can ensure a larger amount of stored charge to hold information thereon, thus leading to improved information holding characteristics. Other advantages are similar to those of the first embodiment.

The semiconductor device according to the present invention can be applied to inexpensive DRAMs which have capacitors with a relatively small capacitance, and are expected to provide a high yield rate, by adjusting the number (=Nm) of wiring layers and the number (=Nc) of capacitor layers.

The present invention can also be applied to a mixed device which has a logic device and DRAM device, and other semiconductor devices which have capacitive elements. Even a small capacitance may be compensated for by an ECC (Error Check and Correct) circuit. The present invention can be applied in the same structure to realize a mixed device which has a logic device and DRAM device, which have a large number of wiring layers, to ultra-high performance DRAMs and high-performance mixed device having a logic device and DRAM device, which have a maximum number of wiring layers and capacitor layers and are specialized for high speeds or low power consumption, thus making it possible to manufacture multiple types of products in a small development period at a low cost.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor device which has a memory cell area including a capacitor for storing data, and a peripheral circuit area for accessing said memory cell area, said method comprising:
   forming an underlying plug in said memory cell area in an underlying insulating film formed on a substrate for connection to said capacitor;
   forming a first wire in said peripheral circuit area on said underlying insulating film, and forming a plate electrode of a first capacitor on said underlying plug in said memory cell area;
   forming a first opening through said plate electrode to reach said underlying plug;
   etching an upper portion of said underlying plug by a predetermined amount;
   forming a capacitive insulating film which covers exposed surfaces of said first wire, said plate electrode, and said underlying plug;
   forming an inter-layer insulating film on said capacitive insulating film;
   etching said capacitive insulating film and said inter-layer insulating film through a mask disposed on said inter-layer insulating film to form a second opening for exposing part of said first wire, and removing the inter-layer insulating film within said first opening to expose part of said underlying plug on the bottom of said first opening; and embedding a conductive material in said first and second openings to form a plug in said peripheral circuit area for connection between wires, and to form a storage electrode of said first capacitor in said memory cell area.

2. The method of manufacturing a semiconductor device according to claim 1, further comprising:

forming a second wire on said wire connection plug, and forming a plate electrode of a second capacitor above the storage electrode of said first capacitor; and performing a procedure from the formation of said first opening to the formation of said plug to form said second capacitor corresponding to said second wire.

3. A method of manufacturing a semiconductor device which has a memory cell area including a capacitor for storing data, and a peripheral circuit area for accessing said memory cell, area, said method comprising:

forming an underlying plug in-said memory cell area in an underlying insulating film formed on a substrate for connection to said capacitor;

forming a conductor and an insulating cap layer in sequence on said underlying insulating film;

forming a first wiring pattern of said conductor and said insulating cap layer in said peripheral circuit area, and forming a plate electrode pattern for a first capacitor of said conductor and said insulating cap layer on said underlying plug in said memory cell area;

forming a first opening through said plate electrode to reach said underlying plug;

etching an upper portion of said underlying plug by a predetermined amount;

forming a capacitive insulating film which covers exposed surfaces of a first wire having said insulating cap layer, said plate electrode, and said underlying plug;

forming an inter-layer insulating film on said capacitive insulating film;

etching said capacitive--insulating film and said inter-layer insulating film through a mask disposed-on said inter-layer insulating film to form a second opening for exposing part of said first wire;

etching said capacitive insulating film and said inter-layer insulating film through a mask disposed on said inter-layer insulating film, said mask having an opening, the dimensions of which are larger than said first opening, to remove said inter-layer insulating film within said first opening and to expose part of said underlying plug on the bottom of said first opening; and embedding a conductive material in said first and second openings to form a plug in said peripheral circuit area for connection between wires, and to form a storage electrode of said first capacitor in said memory cell area.

4. The method of manufacturing a semiconductor device according to claim 3, further comprising:

forming a second wire having the insulating cap layer disposed on the top thereof on said wire connection plug, and forming a plate electrode of a second capacitor, having the insulating cap layer disposed on the top thereof, above the storage electrode of said first capacitor; and performing a procedure from the formation of said first opening to the formation of said plug to form said second capacitor corresponding to said second wire.

* * * * *